United States Patent [19]

Miyata et al.

[11] Patent Number: 4,789,888
[45] Date of Patent: Dec. 6, 1988

[54] SOLID-STATE IMAGE SENSOR

[75] Inventors: Yutaka Miyata, Osaka; Takao Chikamura, Kyoto; Takuo Shibata, Kanagawa; Shinji Fujiwara, Osaka, all of Japan

[73] Assignee: Matsushita Electric Industrial Co., Ltd., Osaka, Japan

[21] Appl. No.: 249,498

[22] Filed: Mar. 31, 1981

[30] Foreign Application Priority Data

Apr. 2, 1980 [JP] Japan ................. 65-43950
Jul. 28, 1980 [JP] Japan ................. 65-103934

[51] Int. Cl.4 .......................................... H01L 27/14
[52] U.S. Cl. .......................................... 357/30; 357/31
[58] Field of Search ............................. 357/31, 30

[56] References Cited

U.S. PATENT DOCUMENTS 4,354,104 10/1982 Chikamura ..................... 357/31

Primary Examiner—Martin H. Edlow
Attorney, Agent, or Firm—Burgess, Ryan & Wayne

[57] ABSTRACT

In a solid-state image sensor of the type consisting of a semiconductor circuit substrate capable of charge transfer or having the switching function and a photoconductive layer or a photosensor, a pattern of light-shielding checks is formed between the surface of the semiconductor circuit substrate and a transparent electrode on the photoconductive layer or a photosensor so as to optically shield the gaps or spaces between electrodes which are provided for respective picture elements and which are connected to their associated diode regions and the photoconductive layer or photosensor, whereby blooming can be suppressed without causing a decrease in sensitivity.

2 Claims, 4 Drawing Sheets

4,789,888

SOLID-STATE IMAGE SENSOR

BACKGROUND OF THE INVENTION

The present invention relates to, in general, a solid-state image sensor and more particularly a solid-state image sensor of the type in which a photoconductive layer or a photosensor is formed over a semiconductor circuit substrate capable of charge transfer or having the switching function.

There have been devised and demonstrated solid-state image sensors of the type comprising, in combination, a photoconductive layer or a photosensor and a matrix of BBD or CCD unit cells capable of charge transfer or an X-Y matrix of MOS switches of the type in which X- and Y-shift registers read out the stored charge. In the solid-state image sensor of the type described above, each picture element is provided with one first electrode which is connected to the photoconductive layer or photosensor and to its associated region which is formed within the bulk of the semiconductor circuit substrate and which is opposite in conduction type to the semiconductor substrate, the region being referred to as "the diode region" in this specification. The incident light which has not been absorbed in a transparent electrode and a photoconductive layer is transmitted through the gaps or spaces between the first electrodes to the semiconductor substrate, resulting in the generation of electron-hole pairs. The holes move through the semiconductor circuit substrate but the electrons flow into the diode regions where the photocharge is stored, into the BBD or CCD charge transfer channels or into the drains of MOS switches. That is, in the case of BBD or CCD, the unwanted charge electrons migrate into the signal electrons, causing a blooming effect. In the case of the X-Y matrix type solid-state image sensor, the drains of the MOS switches in each column are all electrically connected with each other. As a result, the unwanted electrons which flow into the drains also cause blooming; that is, a phenomenon that the signals appear where they should not.

In the conventional solid-state image sensor, each unit cell is coated with an aluminum layer except a light receiving area or color separation filters are coated with metallic (aluminum) light-shielding layers. In general, the aluminum layers have a higher degree of coefficient of reflection, so that the light rays reflected back from the aluminum layers are again reflected back from the surface of the camera lens to the light receiving areas, thus adversely affecting the optical information read-in operation.

SUMMARY OF THE INVENTION

The present invention was made to overcome the above and other problems encountered in the prior art solid-state image sensors and has for its primary object to provide a solid-state image sensor capable of suppressing blooming to a minimum.

According to the present invention, in the solid-state image sensor of the type having a pattern of first electrodes each of which is provided for each picture element and is connected to a photoconductive layer and to its associated diode region; that is, a region which is formed within the bulk of a semiconductor circuit substrate and is opposite in conduction type to the substrate, a pattern of light-shielding checks is formed so as to optically shield the gaps or spaces between the first electrodes so that the incident light can be prevented from reaching the semiconductor circuit substrate and consequently the generation of carriers or electrons can be prevented in the substrate.

More particularly, according to the present invention, in a solid-state image sensor of the type which comprises, in combination, a photoconductive layer or a photosensor and a semiconductor circuit substrate capable of charge transfer or having the switching function and in which each picture element is provided with one first electrode which is connected to the photoconductive layer or the photosensor and to its associated diode region in the substrate, a pattern of light-shielding checks is formed between the semiconductor circuit substrate and a transparent electrode on the photoconductive layer so as to optically shield the gaps or spaces between the first electrodes, whereby the blooming can be suppressed to a minimum without sacrificing sensitivity of the image sensor.

The above and other objects, effects and features of the present invention will become more apparent from the following description of preferred embodiments thereof taken in conjunction with the accompanying drawings.

DETAILED DESCRIPTION OF THE PREFERRED EMBODIMENTS:

CCD and BBD are substantially similar in mode of operation even though, in the former, the charge is stored in depletion regions while, in the latter, the charge is stored in impurity regions. Therefore, the present invention will be described below in conjunction with BBD.

Figure 1:
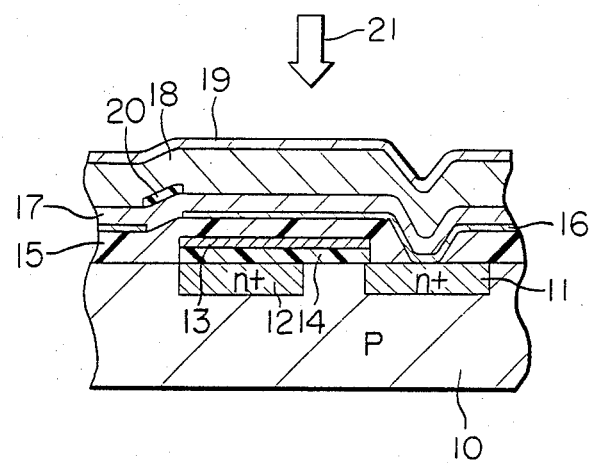
FIG. 1 is a sectional view of a unit cell of a solid-state image sensor in accordance with the present invention of the type in which a photoconductive layer is formed over a semiconductor circuit substrate capable of charge transfer function.

In FIG. 1 is shown a unit cell of a solid-state image sensor having a construction to be described in detail below. An $n^+$-type region 11 is formed in a p-type semiconductor circuit substrate 10 so as to provide a diode. Reference numeral 12 shows an $n^+$-type region which defines a potential well. Reference numeral 13 shows a first gate electrode which partially overlaps with the $n^+$-type region 11. Reference numeral 14 shows an insulating layer between the substrate 10 and the first gate electrode 13. Reference numeral 15 shows an insulating layer for electrically isolating between a first electrode 16 and the substrate 10 and the first gate electrode 13. The first electrode 16 serves not only as an electrode of the diode which is electrically coupled to the n+-type region 11 but also as an electrode of a hole blocking layer 17 consisting of ZnSe or CdS. It is blocked from the adjacent picture elements. Reference numeral 18 shows a photoconductive layer made of $(Zn_{1-x}Cd_xTe)_{1-y}(In_2Te_3)_y$, where $0 \leq x \leq 1$ and $0 \leq y \leq 0.3$. The photoconductor layer 18 is coated with a transparent electrode 19 through which light rays 21 are incident on the photoconductive layer 18. Reference numeral 20 shows a light-shielding check disposed between the hole blocking layer 17 and the photoconductive layer 18 in order to close the gaps between the first electrodes 16. The light-shielding check 20 is one of the most important features of the present invention. The pattern of the light-shielding checks 20 is an inversion of the pattern of the first electrodes 16. The light-shielding checks 20 may be formed with any compound which is optically opaque, but in this embodiment they are made of molybdenum, tantalum or tungsten.

Figure 3:
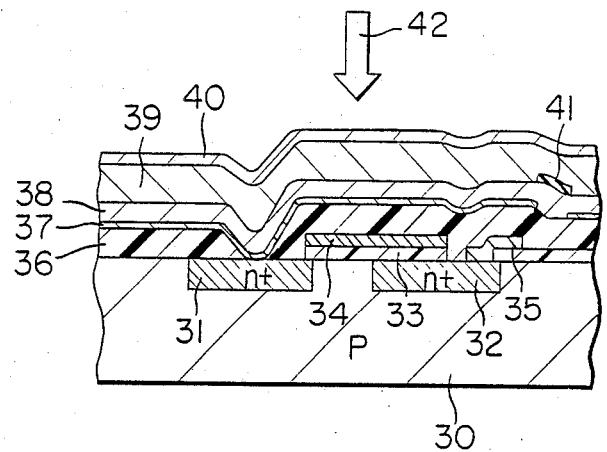
FIG. 3 is a sectional view of a solid-state image sensor in accordance with the present invention of the type in which a photoconductive layer is formed on a semiconductor circuit substrate having the switching function.

Next, an X-Y address type solid-state image sensor in accordance with the present invention will be described. In FIG. 3 is shown a unit cell of a solid-state image sensor of the type in which a photoconductive layer and an electrode are formed on a MOS switch. Within the bulk of a p-type semiconductor circuit substrate 30 are formed n+-type regions 31 and 32 which serve as the source and drain, respectively. Reference numeral 34 shows a gate electrode for the source 31 and the drain 32 and is isolated from the substrate 30 with an oxide layer 33. The gate electrode 34 is connected to the gate electrodes of the picture elements in each column. The drain 32 is connected in common to the drains of the picture elements in each row through an electrode 35. Reference numeral 36 shows an insulating layer which electrically blocks a first electrode 37 from the gate electrode 34. The first electrode 37 is electrically connected to the source region 31 and serves as an electrode of a hole blocking layer 38 consisting of ZnSe or CdS. Reference numeral 39 shows a photoconductive layer made of $(Zn_{1-x\ l\ }Cd_xTe)_{1-y}(In_2Te_3)_y$, where $0 \leq x \leq 1$ and $0 \leq y \leq 0.3$. The photoconductive layer 39 is coated with a transparent electrode 40 through which light rays 42 are incident on the photoconductive layer 39. Reference numeral 41 shows a light-shielding check disposed between the hole blocking layer 38 and the photoconductive layer 39 in order to close the gap between the first electrodes 37. As described previously, the light-shielding check 41 is one of the most important features of the present invention. The pattern of the light-shielding checks 41 is an inversion of the pattern of the first electrodes 37 and the light-shielding checks 41 may be formed with Mo, Ta or W as described previously.

Figure 2A:
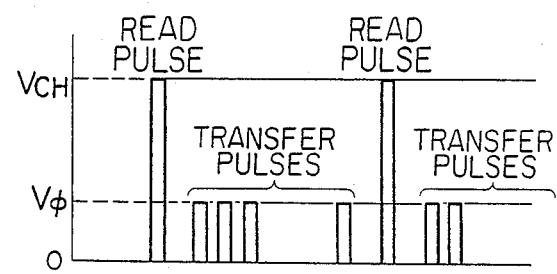
FIGS. 2A and 2B are waveform diagrams used for the explanation of the mode of operation thereof of the unit cell of FIG. 1.
Figure 2B:
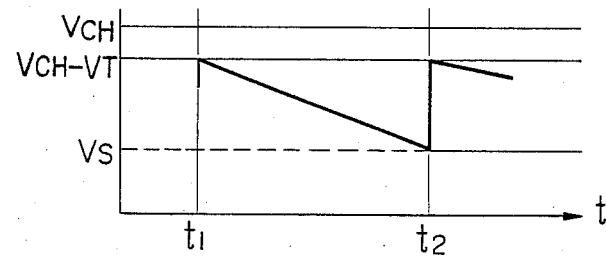

Next, referring to FIGS. 1 and 2, the mode of read-in optical information will be described. Driving pulses as shown in FIG. 2A are applied. At $t_1$, the first electrode 16 rises to $(V_{CH}-V_T)$ as shown in FIG. 2B, where $V_T$ is a threshold voltage of the field-effect transistor FET consisting of the n+-type regions 11 and 12 and the first gate electrode 13. When the light ray 21 is incident, electron-hole pairs are generated in the photoconductive layer 18 and the electrons are attracted toward the electrode 16 while the holes are attracted toward the transparent electrode 19, so that the potential of the first electrode 16 drops. At $t_2$, $V_{CH}$ is applied to the first gate electrode 13, so that the signal electrons are transferred to the n+-type region 12 from the n+-type region 11. As a result, the potential at the n+-type region 11 rises again to $(V_{CH}-V_T)$. In response to the transfer pulse $V_\phi$ as shown in FIG. 2A, the signal electrons are transferred to an output gate from the n+-type region 12.

Figure 4:
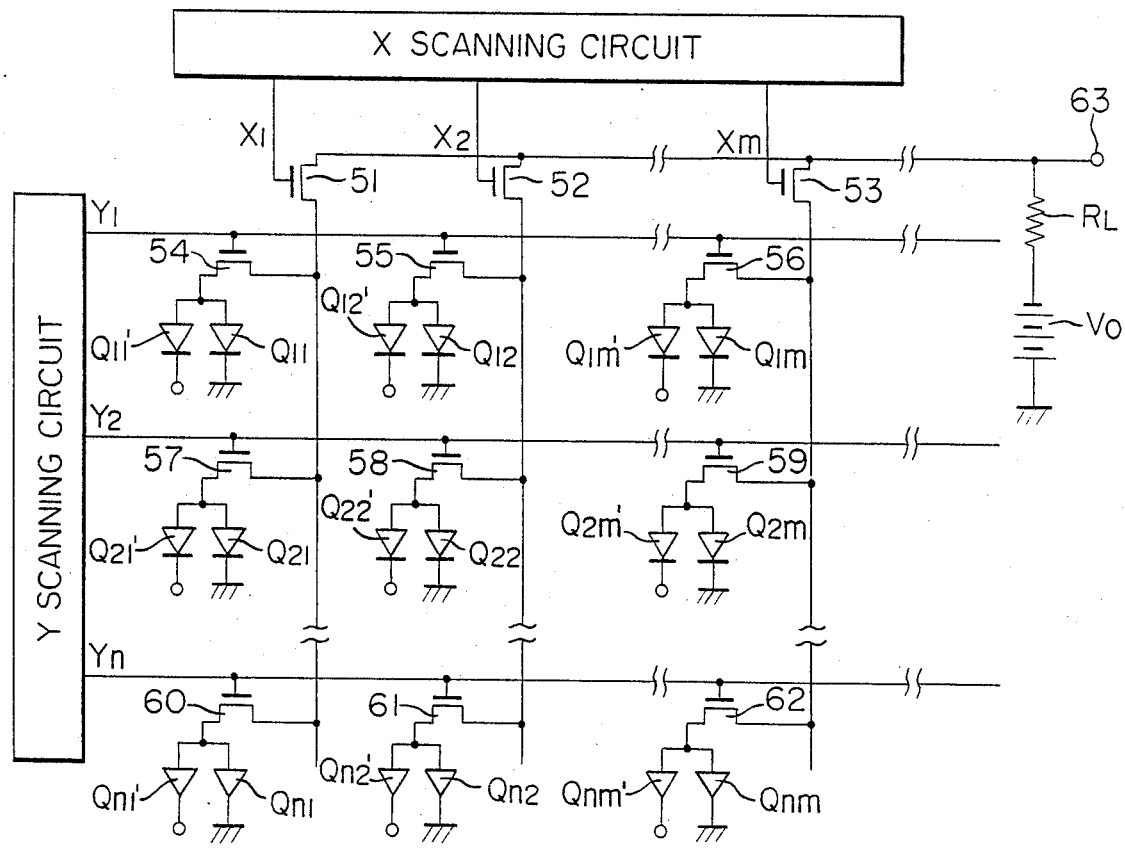
FIG. 4 is a schematic circuit view thereof of the image sensor of FIG. 3.

Next, the mode of operation of a solid-state image sensor of the type consisting of a large number of unit cells of the type shown in FIG. 3 will be described in detail with further reference to FIGS. 4 and 5. In FIG. 4 is shown an image sensor in which the unit cells as shown in FIG. 3 are disposed in an X-Y array. Reference numerals 51 through 62 denote field-effect transistors FETs; $Q_{nm}$, a diode consisting of a semiconductor circuit substrate and an n+-type region; $Q'_{nm}$, a diode consisting of a photoconductive layer; 63, an output terminal; $R_L$, a load resistor; and $V_o$, a power supply.

Figure 5:
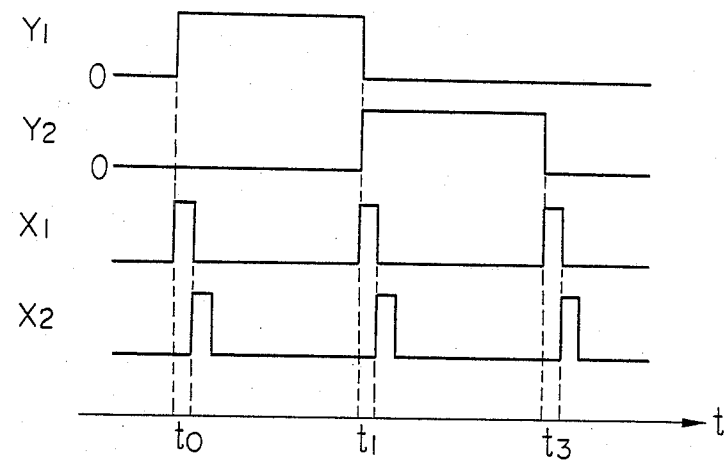
FIG. 5 shows waveform diagrams used for the explanation of the mode of operation thereof of the image sensor of FIGS. 3 and 4.

In FIG. 5 is shown a timing chart of pulses applied to the field-effect transistors 51 through 62 from X and Y scanning circuits. At $t_o$, a pulse is applied to a line $Y_1$, so that the field-effect transistors 54 through 56 are turned on. The X scanning circuit applies pulses sequentially to the X lines starting from the line $X_1$ so that the diodes $Q_{1m}$ and $Q'_{1m}$ are sequentially reverse biased by the power supply $V_o$ through the load resistor $R_L$ starting from the diodes $Q_{11}$ and $Q'_{11}$. At $t_1$, a pulse is applied to a line $Y_2$, so that diodes $Q_{2m}$ and $Q'_{2m}$ are sequentially reverse biased. In like manner, other diodes are sequentially reverse biased.

When the light rays are incident on the diode $Q'_{nm}$, electron-hole pairs are generated in the photoconductive layer and the electrons are attracted toward the first electrode 37. As a result, the potentials of the diodes $Q'_{nm}$ and $Q_{nm}$ drop. This potential drop is in proportion of the quantity of incident light. The optical information is stored for one field or frame time interval. When the X and Y scanning circuits reversely bias the diodes $Q'_{nm}$ and $Q_{nm}$, the power supply $V_o$ supplies a potential which corresponds to the potential drop in proportion to the quantity of incident light through the load resistor $R_L$. As a result, a potential in proportion to the quantity of incident light is derived from the output terminal 63.

Next, the phenomena resulting from the operation of a solid-state image sensor which is not provided with the light-shielding checks so that the gaps between the first electrodes are not optically closed will be described. The light rays of the wavelengths greater than about 500 m$\mu$ are transmitted through the transparent electrode 19 or 40, the photoconductive layer 18 or 39 and the hole blocking layer 17 or 38. With silicon substrates, the upper limit of the wavelengths of light contributing to the generation of electron-holes pairs is 1.1$\mu$. The light which has not been absorbed in the photoconductive layer 18 or 39 and subsequently reached the substrate 10 or 30 generates electron-hole pairs. Holes flow into the ground from the substrate 10 or 30, but the electrons flow into the transfer stage 12 of BBD or CCD or into the drain 32 of MOS switch. In the case of a combination of a photoconductive layer and BBD or CCD, when the optical information for one field is being stored, the optical information for the preceding field is being transferred as described above; that is, the read-in operation and the transfer operation are independent of each other. However, when the carriers are generated in the silicon substrate 10 or 30 by the light transmitted through the gaps between the first electrodes 16, they migrate into a packet of signal electrons to be transferred, so that blooming results; that is, signals appear at the points where they should not appear. When the image sensor is scanned with a spot of light, blooming appears at the image in the vertical direction.

In case of a combination of a MOS switch and a photoconductive layer, the carriers flow into the drain 32 of the MOS switch and spread along the electrode 35 in the vertical or column direction and migrate into the packets of signal electrons which are being read out from another column. As a result, the blooming occurs. In this specification, the degree or magnitude of blooming is defined as "a ratio between the quantity or number of carriers causing the blooming and the quantity or number of signal electrons".

In the embodiments of the present invention, when the image sensor is scanned with a spot of light equal to 1/10 in size to a raster, the degree or magnitude of blooming is 15% when the light is 750 mµ in wavelength. With the white light, the light signal is saturated at 5.4 lx with the blooming of 3.1% and at 324 lx with the resulting blooming of 50%. In the case of the solid-state image sensor of the present invention which is used with an infrared-cutting filter with a half value of 650 mµ, the surface illumination causing a saturation is 10 lx. The blooming becomes 10% of the signal when the surface illumination is 140 times (1400 lx) as high as the saturation surface illumination using the spot of light as mentioned above.

Figure 6:
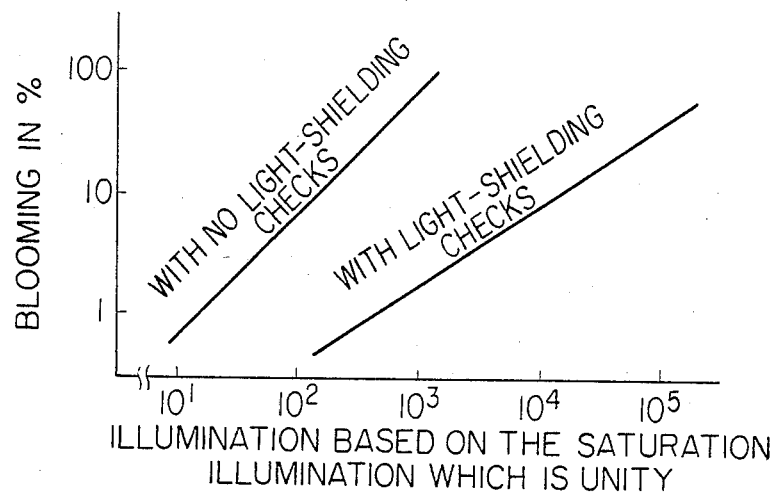
FIG. 6 is a graph showing the relationship between the magnitude of blooming and the saturation illumination in a solid-state image sensor in accordance with the present invention.

When the solid-state image sensor in which the gaps between the first electrodes are optically shielded as described previously is scanned through the infrared-cutting filter with the spot of light under the same conditions as described above, the blooming becomes 10% when illuminated with the surface illumination 16,000 times as high as the saturation surface illumination as shown in FIG. 6. The blooming becomes 10% when scanned or illuminated with the white light 300 times as high as the saturation surface illumination under the same conditions as described above.

So far the pattern of the light-shielding checks between the hole blooming layer and the photoconductive layer which optically shield the gaps between the first electrodes has been described as being an inversion of the pattern of the first electrode. The light-shielding checks may be formed within the bulk of an insulating layer formed on a semiconductor circuit substrate by a conventional process. The process of the present invention will be described below with reference to FIGS. 7A and 7B. The processes for fabricating the semiconductor circuit substrates with light-shielding checks for CCD, BBD and X-Y address types are substantially similar, so that the process will be described in conjunction with BBD.

Figure 7A:
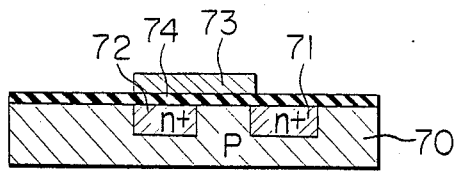
FIGS. 7A through 7F show the steps for fabricating a solid-state image sensor in accordance with the present invention.
Figure 7B:
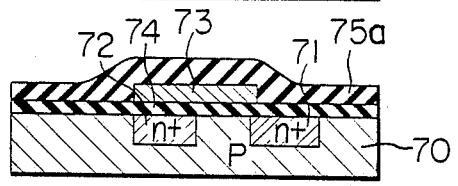
Figure 7C:
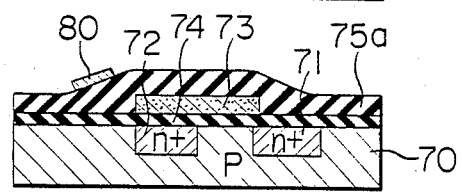
Figure 7D:
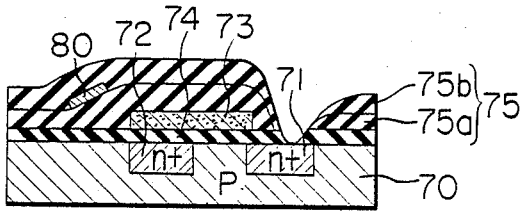
Figure 7E:
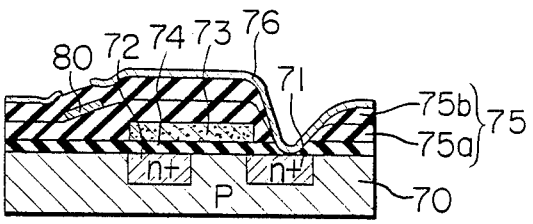
Figure 7F:
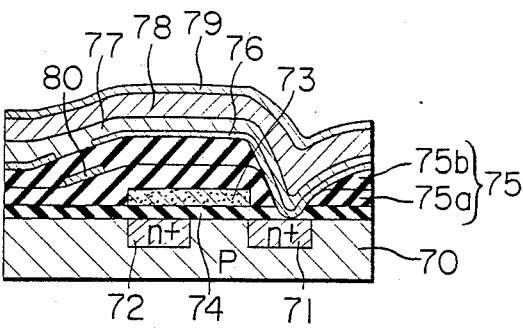

As shown in FIG. 7A, a semiconductor circuit substrate 70 for CCD or BBD has n+-type regions 71 and 72 formed by a diffusion process and a $SiO_2$ layer 74 formed by the pyrolytic oxidation processes and a first gate electrode 73. A first layer $75_a$ of $SiO_2$ (PSG) containing 5 to 20% of $P_2O_5$ is formed by the CVD process and is subjected to the heat-treatment at about 1100° C. in the atmosphere containing $N_2$, $O_2$ and $POCl_3$ gases, so that the steps may be made gentler as shown in FIG. 7B. Next, light-shielding checks 80 of $MoSi_2$, $TaSi_2$ or $WSi_2$ are deposited over the surface of the first layer $75_a$ by the sputtering process into a pattern which is an inversion of the pattern of the first electrodes 76. Following the procedure for forming the first layer $75_a$, a second layer $75_b$ is formed over the light-shielding checks 20 and the first layer $75_a$. Thereafter, a contact hole or window is opened which has the cross sectional area equal to or less than the area of the n+-type region 71 as shown in FIG. 7D. The substrate 70 is then subjected to the heat-treatment under the same conditions as described above, so that the steps may be made gentler as shown in FIG. 7D. Thus, an insulating layer 75 consisting of the first and second layers $75_a$ and $75_b$ is formed. Next, a Mo, Ta or W metallic layer is deposited over the insulating layer 75 and the contact hole by the sputtering process and then etched by the photolithographic process into a mosaic of picture elements or first electrodes 76 as shown in FIG. 7E. Thereafter, a hole blocking layer 77 is formed over the first electrodes 76 and the insulating layer 75 by the vacuum evaporation of ZnSe, ZnS, CdS or CdSe. Next, a photoconductive layer 78 of $(Zn_{1-x}Cd_xTe)_{1-y}(In_2Te_3)_y$ is formed by the vacuum evaporation process. The substrate 70 is further subjected to the heat-treatment at 300° C. to 600° C. and then a transparent electrode (that is, ITO layer or film) 79 is formed over the photoconductive layer 78 by the sputtering process as shown in FIG. 7F. Thus, the solid-state image sensor in accordance with the present invention is provided.

In addition to the compounds for the light-shielding checks 80 described previously, there may be proposed the use of Ni or Cr, but Ni or Cr have a higher chance for setting a deep energy level in the semiconductor circuit substrate. In order to prevent this problem, related techniques must be further advanced, so that the use of Ni or Cr is not practical at present. There may be proposed a pattern of light-shielding checks 80 which is formed in a mosaic filter for a color camera, but the light-shielding checks must be made larger in size than the gaps between the first electrodes 76 in order to shield the light rays incident at angles relative to the vertical. Furthermore, the carriers which are generated in the photoconductive layer 78 above the gaps between the first electrodes 76 will adversely affect the signal electrons, so that the sensitivity of a solid-state image sensor will considerably drop.

In summary, according to the present invention, the problem of the decrease in sensitivity as described above can be overcome. In addition, the width of the light-shielding checks 80 can be made considerably greater than the gaps between the first electrodes 76 so that the complete light-shielding effects can be attained. Furthermore, the light-shielding layers or checks 80 are embedded in the insulating layer 75 so that the possibility for causing the short-circuits between the light-shielding checks 80 and the gate electrodes 73 can be reduced to a minimum. According to the results of the experiments conducted by the inventors, the short-circuit failure rate is about $(5 \times 10^{-5})$ % when the insulating layer 75 includes no first layer $75_a$, but the failure rate becomes less than $(1 \times 10^{-6})$ % which is negligible when the first layer $75_a$ is present.

So far, the light-shielding checks 80 have been formed or embedded in the insulating layer or the photoconductive layer, but the insulating layer 75 itself can be made opaque. The compound for the photoconductive layer 78 is not limited to $(Zn_{1-x}Cd_xTe)_y(In_2Te_3)_{1-y}$ and any suitable compound such as amorphous silicon may be used. Furthermore, the blooming can be suppressed by the selection of the compounds for the first electrodes 76 and the light-shielding checks 80 and by the processes for forming them.

What is claimed is:

1. A solid-state image sensor comprising:
   (a) a semiconductor circuit substrate with diode regions and one of charge-transfer and switching elements for deriving a signal corresponding to electrons stored in the diode regions,
   (b) an insulating layer formed over said semiconductor circuit substrate and formed with contact holes for connection to said diode regions,
   (c) a pattern of unit cell electrodes formed over said insulating layer, each unit cell electrode being partially in contact with a corresponding diode region through a corresponding contact hole,
   (d) a photoconductive layer formed over said electrodes and said insulating layer,
   (e) a transparent electrode formed over said photoconductive layer, and
   (f) a pattern of light-shielding checks disposed between the surface of said semiconductor circuit substrate and said photoconductive layer to optically shield gaps formed between said unit cell electrodes.

2. A solid-state image sensor as set forth in claim 1; in which
   the pattern of light-shielding checks is made of one of Mo, Ta, W and a silicide thereof, and is formed over said insulating layer, and further comprising another insulating layer formed over said pattern of light-shielding checks.

* * * * *